United States Patent
Jung et al.

(10) Patent No.: US 9,627,644 B2
(45) Date of Patent: Apr. 18, 2017

(54) ORGANIC LIGHT EMITTING DIODE DEVICE

(71) Applicant: Samsung Display Co., Ltd., Yongin, Gyeonggi-Do (KR)

(72) Inventors: Bo-Ra Jung, Yongin (KR); Kyu-Hwan Hwang, Yongin (KR); Seok-Gyu Yoon, Yongin (KR); Eung-Do Kim, Yongin (KR); Dong-Chan Kim, Yongin (KR); Won-Jong Kim, Yongin (KR); Young-Woo Song, Yongin (KR); Jong-Hyuk Lee, Yongin (KR); Sung-Chul Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/030,870

(22) Filed: Sep. 18, 2013

(65) Prior Publication Data

US 2014/0225081 A1 Aug. 14, 2014

(30) Foreign Application Priority Data

Feb. 8, 2013 (KR) ........................ 10-2013-0014685

(51) Int. Cl.
*H01L 51/52* (2006.01)

(52) U.S. Cl.
CPC ...... *H01L 51/5221* (2013.01); *H01L 51/5234* (2013.01)

(58) Field of Classification Search
CPC ....... H01L 51/5203–51/5234; H01L 2251/301

USPC .............. 257/79–103, 40; 313/504; 428/690
See application file for complete search history.

(56) References Cited

U.S. PATENT DOCUMENTS

| | | | |
|---|---|---|---|
| 6,262,441 B1 * | 7/2001 | Bohler et al. | 257/103 |
| 6,316,874 B1 * | 11/2001 | Arai et al. | 313/504 |
| 7,297,415 B2 * | 11/2007 | Noguchi et al. | 428/690 |
| 2009/0174315 A1 * | 7/2009 | Furukawa et al. | 313/504 |
| 2010/0038633 A1 * | 2/2010 | Yang | H01L 51/5275 257/40 |
| 2010/0301741 A1 * | 12/2010 | Kim | H01L 51/5234 313/504 |
| 2011/0101379 A1 * | 5/2011 | Sugisawa et al. | 257/79 |
| 2011/0241038 A1 * | 10/2011 | Kashiwabara et al. | 257/89 |
| 2011/0279024 A1 * | 11/2011 | Hiyama et al. | 313/504 |
| 2012/0007055 A1 | 1/2012 | Kim et al. | |
| 2013/0026456 A1 * | 1/2013 | Hwang et al. | 257/40 |

FOREIGN PATENT DOCUMENTS

| | | |
|---|---|---|
| JP | 10-149884 A | 6/1998 |
| KR | 10-2004-0103059 A | 12/2004 |
| KR | 10-2008-0002192 A | 1/2008 |
| KR | 10-2011-0065078 A | 6/2011 |
| TW | 201230324 A1 | 7/2012 |

* cited by examiner

*Primary Examiner* — Laura Menz
*Assistant Examiner* — Candice Y Chan
(74) *Attorney, Agent, or Firm* — Knobbe Martens Olson & Bear LLP

(57) ABSTRACT

In an aspect, an organic light emitting diode device including a first electrode, a second electrode facing the first electrode, and an emission layer positioned between the first electrode and second electrode, wherein the first electrode includes samarium (Sm) is provided.

7 Claims, 8 Drawing Sheets

ORGANIC LIGHT EMITTING DIODE DEVICE

INCORPORATION BY REFERENCE TO RELATED APPLICATIONS

Any and all priority claims identified in the Application Data Sheet, or any correction thereto, are hereby incorporated by reference under 37 CFR 1.57. For example, this application claims priority to and the benefit of Korean Patent Application No. 10-2013-0014685 filed on Feb. 8, 2013 in the Korean Intellectual Property Office, the disclosure of which is incorporated in its entirety herein by reference.

BACKGROUND

Field

The described technology relates generally to an organic light emitting diode device.

Description of the Related Technology

Recently, demand for reduced size and thickness of a monitor, a television, and the like has promoted replacement of a cathode ray tube (CRT) with a liquid crystal display (LCD). However, the liquid crystal display (LCD) needs a separate backlight as a non-emissive device and also has limitations in terms of response speed and viewing angle.

Recently, these disadvantages have been proposed to be overcome by using an organic light emitting diode device (OLED) display.

Typically, an organic light emitting diode device includes two electrodes and an emission layer disposed therebetween and emits a light when electrons injected from one electrode are combined with holes injected from the other electrode forming excitons and releasing energy.

Light emitted from the emission layer emits through at least one of two electrodes. Accordingly, optical properties of the electrodes may have an influence on efficiency of the organic light emitting diode device.

SUMMARY

One embodiment provides an organic light emitting diode device including an electrode having high transmittance.

According to one embodiment, provided is an organic light emitting diode device that includes a first electrode, a second electrode facing the first electrode, and an emission layer positioned between the first electrode and second electrode, wherein the first electrode includes samarium (Sm).

In some embodiments, the first electrode may include samarium (Sm) and at least one metal selected from silver (Ag), aluminum (Al), magnesium (Mg), chromium (Cr), manganese (Mn), iron (Fe), cobalt (Co), nickel (Ni), copper (Cu), indium (In), tin (Sn), molybdenum (Mo), niobium (Nb), ruthenium (Ru), or an alloy thereof.

In some embodiments, the first electrode may be a single layer including an alloy of the samarium (Sm) and the metal.

In some embodiments, the single layer may have a thickness of about 30 Å to about 150 Å.

In some embodiments, the first electrode may include a first layer including samarium (Sm) and a second layer including the alloy of samarium (Sm) and the metal.

In some embodiments, the first layer may have a thickness of about 5 Å to about 100 Å, and the second layer may have a thickness of about 30 Å to about 150 Å.

In some embodiments, the alloy may include the samarium (Sm) and the metal in a volume ratio of about 1:100 to about 100:1.

In some embodiments, the alloy may include the samarium (Sm) and the metal in a volume ratio of about 1:100 to about 20:100.

In some embodiments, the first electrode may have light transmittance of greater than or equal to about 60% in a wavelength region of about 450 nm to about 700 nm.

In some embodiments, the first electrode may have light transmittance of about 60% to about 95% in a wavelength region of about 450 nm to about 700 nm.

In some embodiments, the second electrode may include a reflecting electrode, and the emission layer may be configured to emit a white light.

In some embodiments, the second electrode may include a transparent electrode, and the emission layer may be configured to emit a white light.

In some embodiments, the first electrode may be a cathode.

In some embodiments, the organic light emitting diode device may have improved photoefficiency by increasing light transmittance.

DETAILED DESCRIPTION

Figure 1:
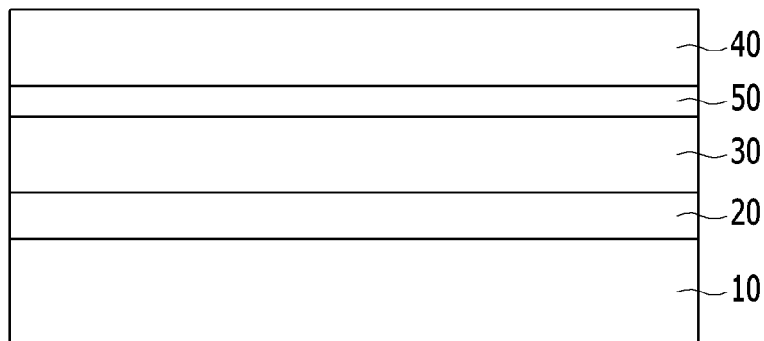
FIG. 1 is a cross-sectional view of an organic light emitting diode device according to one embodiment.

The present disclosure will be described more fully hereinafter with reference to the accompanying drawings, in which exemplary embodiments of this disclosure are shown. This disclosure may, however, be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an organic light emitting diode device in accordance with one embodiment will be described referring to FIG. 1.

FIG. 1 is a cross-sectional view showing an organic light emitting diode device according to one embodiment.

Referring to FIG. 1, the organic light emitting diode device according to one embodiment includes a substrate 10, a lower electrode 20, an upper electrode 40 facing the lower electrode 20, and an emission layer 30 interposed between the lower electrode 20 and the upper electrode 40.

In some embodiments, the substrate 10 may include, for example, an inorganic material such as glass or an organic material such as polycarbonate, polymethylmethacrylate, polyethyleneterephthalate, polyethylenenaphthalate, polyamide, polyethersulfone, or a combination thereof, a silicon wafer, and the like.

One of the lower electrode 20 and the upper electrode 40 is a cathode, and the other is an anode. For example, the lower electrode 20 may be an anode, and the upper electrode 40 may be a cathode.

At least either one of the lower electrode 20 and the upper electrode 40 is transparent. When the lower electrode 10 is transparent, an organic light emitting diode device may have a bottom emission in which a light is emitted toward the substrate 10, while when the upper electrode 40 is transparent, the organic light emitting diode device may have a top emission in which a light is emitted toward the opposite of the substrate 10. In addition, when the lower electrode 20 and upper electrode 40 are all transparent, a light may be emitted toward the substrate 10 and the opposite of the substrate 10 in both directions.

In some embodiments, the transparent electrode may include samarium (Sm). In some embodiments, the samarium (Sm) may have improved adhesion with an organic layer, and improved electron injection properties due to low work function. In some embodiments, the samarium (Sm) prevents aggregation of the metal such as silver (Ag) and also prevents decrease of transmittance of an electrode caused by aggregation of the metal.

In some embodiments, the transparent electrode may include a samarium (Sm) alloy, and the samarium (Sm) alloy may include at least one metal selected from silver (Ag), aluminum (Al), magnesium (Mg), chromium (Cr), manganese (Mn), iron (Fe), cobalt (Co), nickel (Ni), copper (Cu), indium (In), tin (Sn), molybdenum (Mo), niobium (Nb), ruthenium (Ru), or an alloy thereof, as well as samarium (Sm).

In some embodiments, the samarium (Sm) alloy may include, for example the samarium (Sm) and the metal in a volume ratio of about 1:100 to about 100:1. Within the range, they may be included in a volume ratio of about 1:100 to about 20:100.

In some embodiments, the transparent electrode may be a single layer including the samarium (Sm) alloy. The single layer may have a thickness of about 30 Å to about 150 Å. Within the range of the thickness, transmittance may be improved while high efficiency being maintained due to appropriate microcavities.

In some embodiments, the transparent electrode may have light transmittance of greater than or equal to about 60% in a visible ray region, particularly a wavelength region of about 450 nm to about 700 nm. Within the range, the transparent electrode may have light transmittance of about 60% to about 95%, and specifically about 60% to about 85%.

When the lower electrode 20 and the upper electrode 40 are all transparent electrodes, one electrode is made of the aforementioned samarium (Sm) alloy, while the other electrode is made of the aforementioned samarium (Sm) alloy or transparent conductive oxide. In some embodiments, the transparent conductive oxide may be, for example, an indium tin oxide (ITO), an indium zinc oxide (IZO), or the like.

When one of the lower electrode 20 and the upper electrode 40 is a transparent electrode, the transparent electrode may be made of the aforementioned samarium (Sm) alloy, while the other is a reflecting electrode made of an opaque conductor. The opaque conductor may be a metal, for example, aluminum (Al), copper (Cu), molybdenum (Mo), silver (Ag), an alloy thereof, or a combination thereof.

In some embodiments, the transparent electrode may form a microcavity together with the reflecting electrode. Accordingly, light emitted from the emission layer 30 is repeatedly reflected between the transparent electrode and the reflecting electrode leaving a predetermined interval to cause the strong interference effect between the lights, thereby light having a predetermined wavelength may be amplified to increase photoefficiency.

In some embodiments, the emission layer 30 may be made of an organic material emitting one light among primary colors such as red, green, blue, and the like, or a mixture of an inorganic material with the organic material, for example, a polyfluorene derivative, a (poly)paraphenylenevinylene derivative, a polyphenylene derivative, a polyfluorene derivative, polyvinylcarbazole, a polythiophene derivative, or a compound prepared by doping these polymer materials with a perylene-based pigment, a cumarine-based pigment, a rothermine-based a pigment, rubrene, perylene, 9,10-diphenylanthracene, tetraphenylbutadiene, Nile red, coumarin, quinacridone, and the like. An organic light emitting diode device displays a desirable image by a spacious combination of primary colors emitted by an emission layer therein.

In some embodiments, the emission layer 30 may emit a white light by combining three primary colors such as red, green, and blue. Specifically, the emission layer 30 may emit a white light by combining colors of neighboring sub-pixels or by combining laminated colors in a vertical direction.

In some embodiments, an auxiliary layer 50 may be positioned between emission layer 30 and the upper electrode 40 to improve luminous efficiency. In FIG. 1, the auxiliary layer 50 is shown only between the emission layer 30 and the upper electrode 40 but is not limited thereto and may be positioned between the emission layer 30 and the upper electrode 40, and between the emission layer 30 and the lower electrode 20.

In some embodiments, the auxiliary layer 50 may include an electron transport layer (ETL) and a hole transport layer (HTL) for balancing between electrons and holes, an electron injection layer (EIL), a hole injection layer (HIL) for reinforcing injection of electrons and holes, and the like. It may include one or more layers selected therefrom.

Hereinafter, an organic light emitting diode device in accordance with another embodiment will be described referring to FIG. 2.

Figure 2:
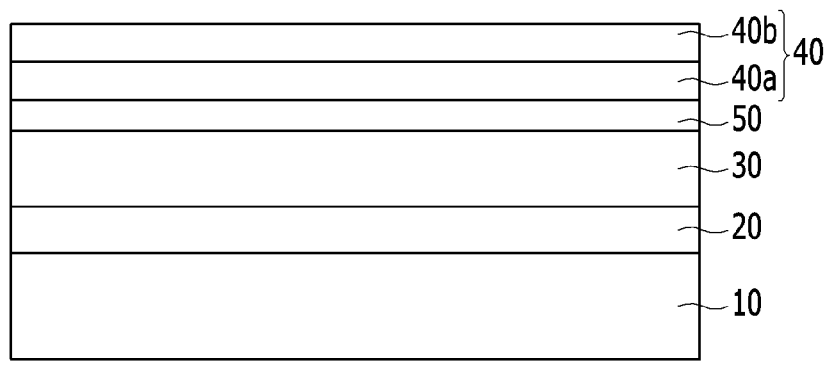
FIG. 2 is a cross-sectional view of an organic light emitting diode device according to another embodiment.

FIG. 2 is a cross-sectional view of an organic light emitting diode device according to another embodiment.

Referring to FIG. 2, the organic light emitting diode device includes a substrate 10, a lower electrode 20, an emission layer 30, an upper electrode 40, and an auxiliary layer 50, like the embodiment shown in FIG. 1.

Unlike the embodiment shown in FIG. 1, the upper electrode 40 includes a plurality of layers 40a and 40b. Although the case that the upper electrode 40 is a transparent electrode and has a structure of plural layers is shown as one example in above, it is not limited thereto. When the lower electrode 20 is a transparent electrode, the lower electrode 20 may have a structure of a plurality of layers, and in the case of dual light emitting structure that both the lower electrode 20 and the upper electrode 40 are transparent electrodes, at least one of lower electrode 20 and upper electrode 40 may have a structure of a plurality of layers.

In some embodiments, the transparent electrode may include a first layer including samarium (Sm) and a second layer including an alloy of samarium (Sm) and at least one metal selected from silver (Ag), aluminum (Al), magnesium (Mg), chromium (Cr), manganese (Mn), iron (Fe), cobalt (Co), nickel (Ni), copper (Cu), indium (In), tin (Sn), molybdenum (Mo), niobium (Nb), ruthenium (Ru) or an alloy thereof.

In some embodiments, the samarium (Sm) alloy may include, for example the samarium (Sm) and the metal in a volume ratio of about 1:100 to about 100:1. Within the range, the samarium (Sm) and the metal may be included in a volume ratio of about 1:100 to about 20:100. When the samarium (Sm) and the metal are included within the above ratio, transmittance and electron injection properties may be improved efficiently.

In some embodiments, the transparent electrode may include a first layer including samarium (Sm) and a second layer including a samarium (Sm) alloy, the electron may be easily injected to reduce the driving voltage for light-emitting.

In some embodiments, the first layer may have a thickness of about 5 Å to about 100 Å, and the second layer may have a thickness of about 30 Å to about 150 Å. Within the range of the thickness, transmittance may be improved while high efficiency being maintained due to appropriate microcavity.

The following examples illustrate the present embodiments in more detail. These examples, however, are not in any sense to be interpreted as limiting the scope of this disclosure.

Formation of Transparent Thin Film

Example 1

Samarium (Sm) and silver (Ag) were thermal-evaporated at a volume ratio of 5:95 on a glass substrate to provide an 8.0 nm-thick samarium-silver alloy (AgSm) thin film.

Example 2

Samarium (Sm) and silver (Ag) were thermal-evaporated at a volume ratio of 5:95 on a glass substrate to provide a 14.0 nm-thick samarium-silver alloy (AgSm) thin film.

Example 3

1.5 nm-thick samarium (Sm) thin film and 8.0 nm-thick samarium-silver alloy (AgSm) thin film including samarium (Sm) and silver (Ag) at a volume ratio of 5:95 were thermal-evaporated on a glass substrate to provide a double layered thin film.

Example 4

1.5 nm-thick samarium (Sm) thin film and 13.0 nm-thick samarium-silver alloy (AgSm) thin film including samarium (Sm) and silver (Ag) at a volume ratio of 5:95 were thermal-evaporated on a glass substrate to provide a double layered thin film.

Comparative Example 1

Magnesium (Mg) and silver (Ag) were thermal-evaporated at a volume ratio of 90:10 on a glass substrate to provide a 12.0 nm-thick magnesium (Mg)-silver (Ag) alloy thin film.

Evaluation 1: Light Transmittance, Reflectance, Absorption Ratio

The thin films obtained from Examples 1 to 4 and Comparative Example 1 were measured for light transmittance, reflectance, and absorption ratio. The light transmittance, the reflectance, and the absorption ratio were measured using a UV visible spectrophotometer.

The results are shown in FIG. 3 to FIG. 8.

Figure 3:
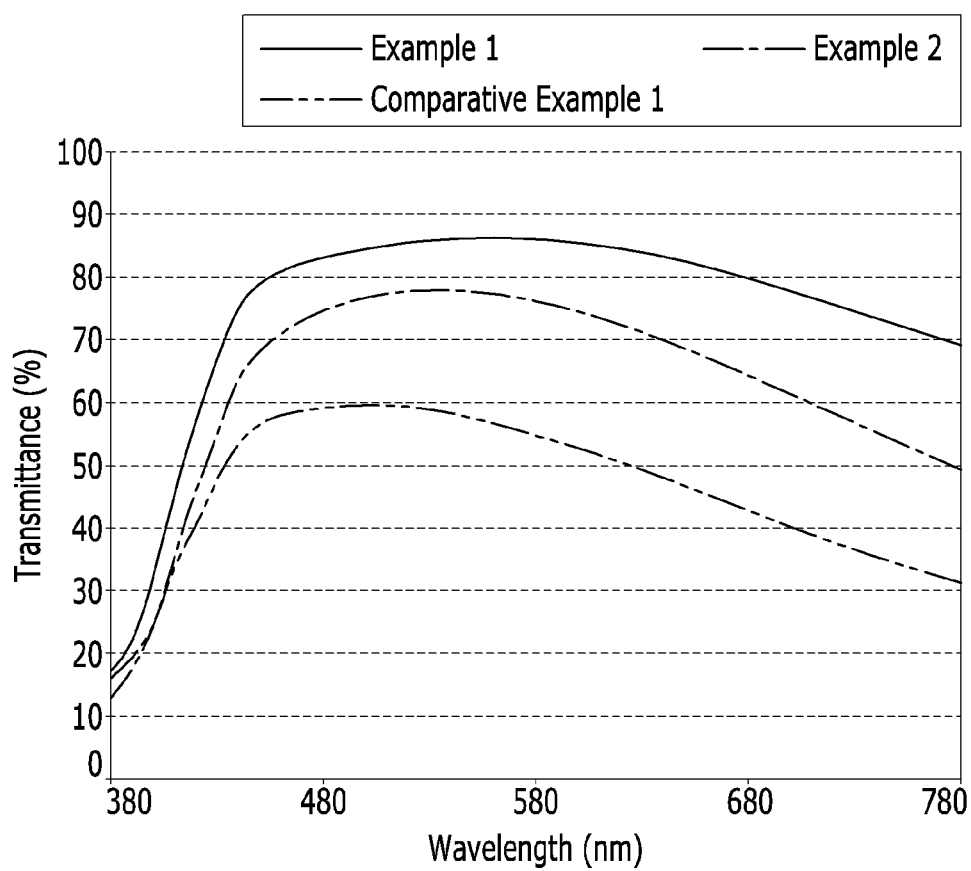
FIG. 3 is a graph showing transmittances of the thin films according to Examples 1 and 2 and Comparative Example 1.
Figure 4:
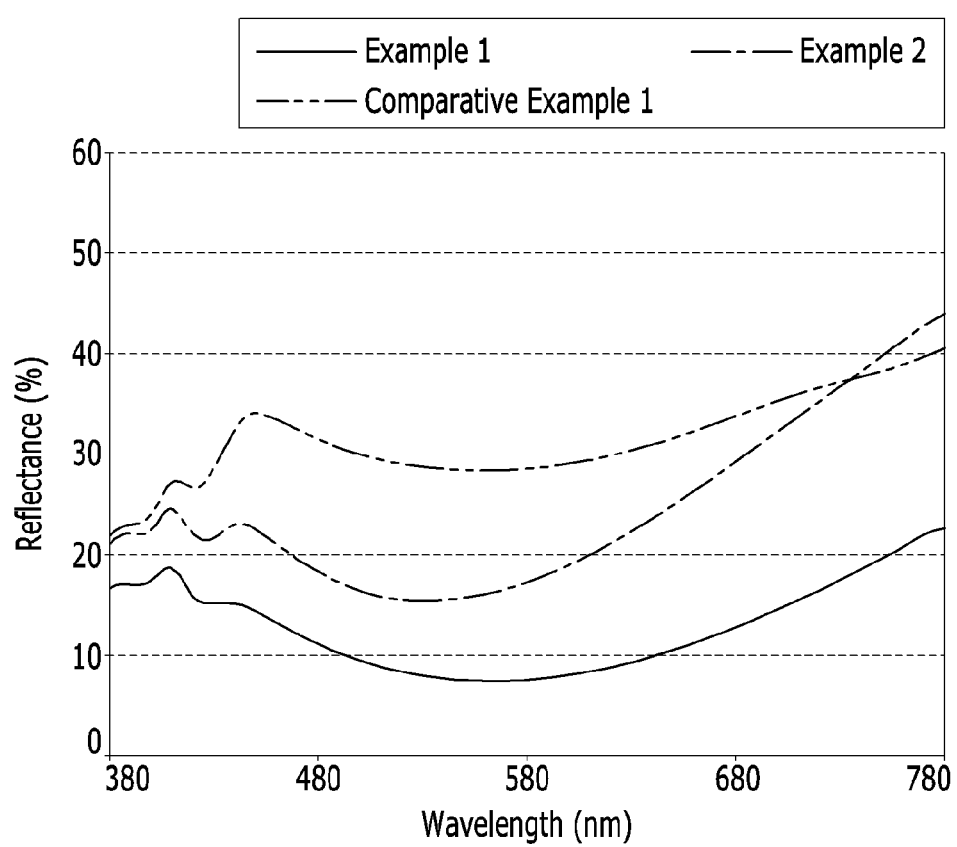
FIG. 4 is a graph showing reflectance of the thin films according to Examples 1 and 2 and Comparative Example 1.
Figure 5:
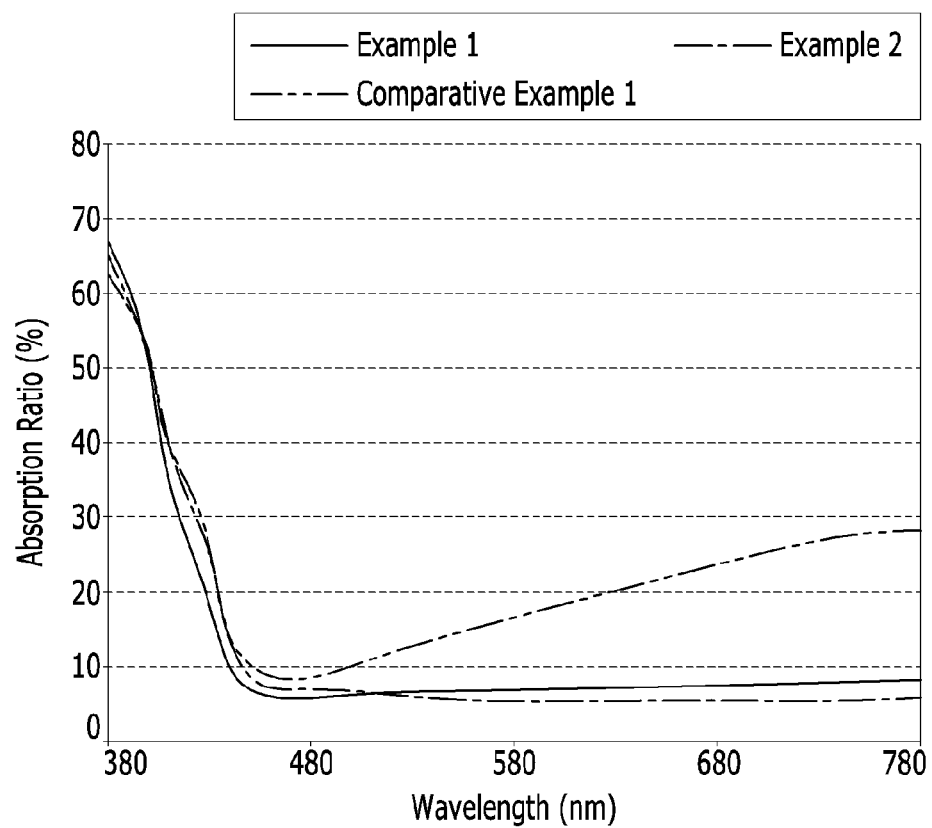
FIG. 5 is a graph showing the absorption ratio of the thin films according to Examples 1 and 2 and Comparative Example 1.
Figure 6:
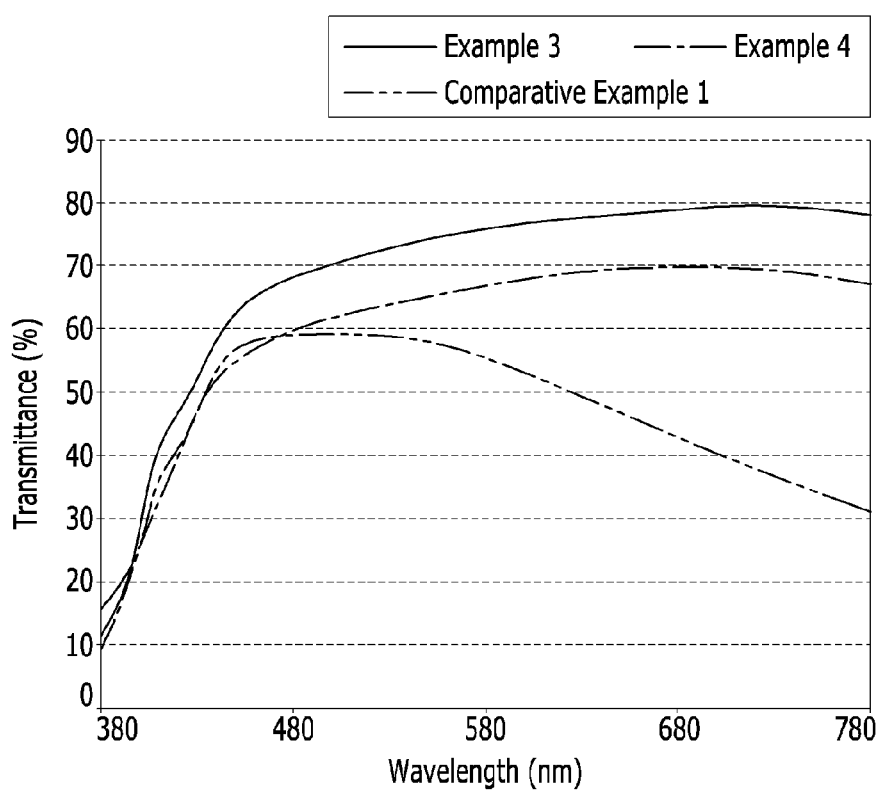
FIG. 6 is a graph showing transmittances of the thin films according to Examples 3 and 4 and Comparative Example 1.
Figure 7:
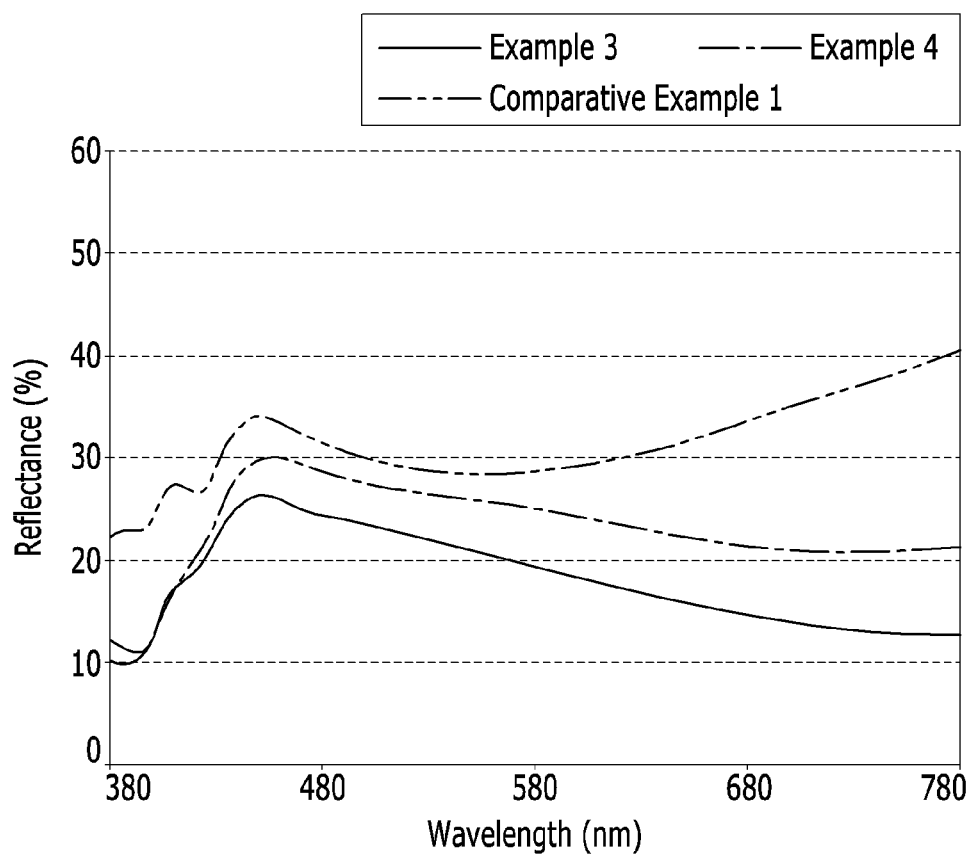
FIG. 7 is a graph showing reflectance of the thin films according to Examples 3 and 4 and Comparative Example 1.
Figure 8:
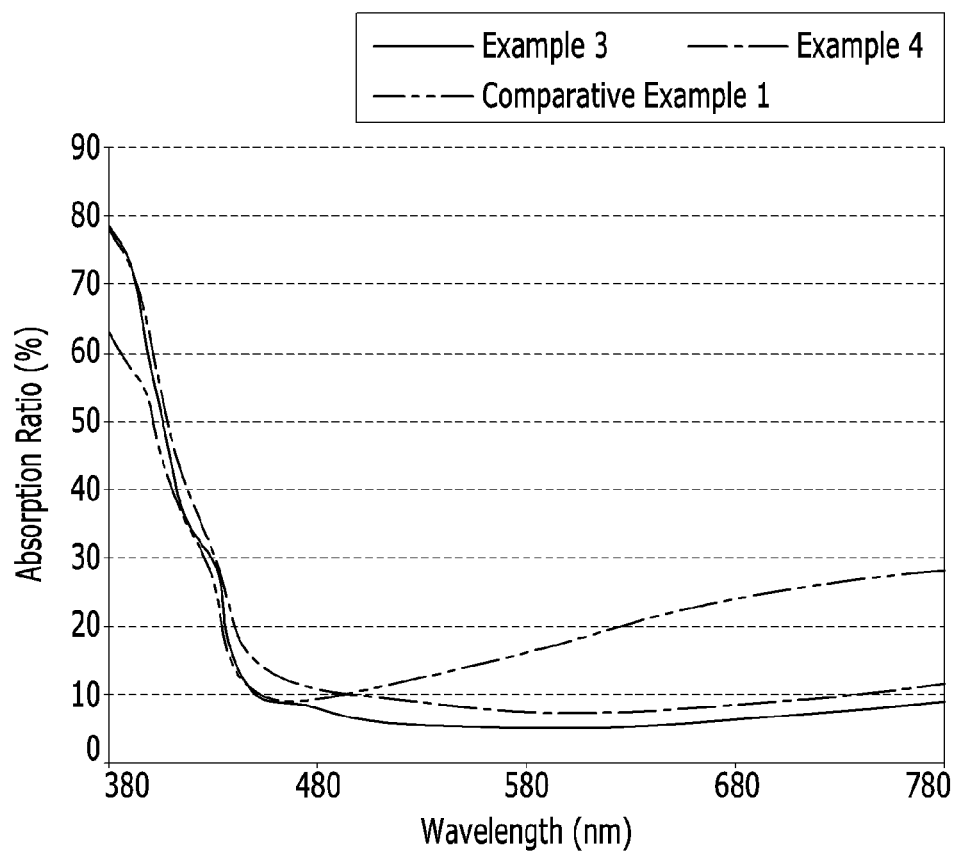
FIG. 8 is a graph showing the absorption ratio of the thin films according to Examples 3 and 4 and Comparative Example 1.

FIG. 3 is a graph showing transmittances of the thin films according to Examples 1 and 2 and Comparative Example 1, FIG. 4 is a graph showing reflectance of the thin films according to Examples 1 and 2 and Comparative Example 1, FIG. 5 is a graph showing the absorption ratio of the thin films according to Examples 1 and 2 and Comparative Example 1, FIG. 6 is a graph showing transmittances of the thin films according to Examples 3 and 4 and Comparative Example 1, FIG. 7 is a graph showing reflectance of the thin films according to Examples 3 and 4 and Comparative Example 1, and FIG. 8 is a graph showing the absorption ratio of the thin films according to Examples 3 and 4 and Comparative Example 1.

Referring to FIG. 3 to FIG. 8, the thin films obtained from Examples 1 to 4 had higher light transmittance and lower reflectance and absorption ratio than those of the thin film obtained from Comparative Example 1. When using the thin films according to Examples 1 to 4 as electrodes. it is estimated that light emitted from the emission layer may be reflected or adsorbed by the electrode reducing light loss, and the amount of light emitted to outside through the electrode may be increased to improve efficiency.

Fabrication of Organic Light Emitting Diode Device

Example 5

An ITO anode was sputtered on a glass substrate and patterned. m-MTDATA was vacuum-evaporated on the ITO anode to provide a hole injection layer (HIL) having a thickness of 750 Å. Then α-NPD was vacuum-evaporated on the hole injection layer (HIL) in a thickness of 150 Å to provide a hole transport layer (HTL). After providing the hole transport layer (HTL), a red emission layer of triphenylamine derivative, a green emission layer of fluorene derivative, and a blue emission layer of perylene derivative were formed on the hole transport layer (HTL) in a thickness of 400 Å, 200 Å, 200 Å, respectively.

Then $Alq_3$ was vacuum-evaporated on the emission layer to provide an electron transport layer (ETL) having a thickness of 200 Å. Samarium (Sm) and silver (Ag) were thermal-evaporated thereon at a volume ratio of 5:95 to provide a cathode made of 90 Å-thick samarium (Sm)-silver (Ag) alloy, and thereby an organic light emitting diode device was fabricated.

Example 6

An organic light emitting diode device was fabricated in accordance with the same procedure as in Example 5, except that the cathode was formed of double layers of a 1.5 nm-thick samarium (Sm) layer and a 9.0 nm-thick samarium (Sm)-silver (Ag) alloy layer evaporated with samarium (Sm) and silver (Ag) at a volume ratio of 5:95, instead of the cathode made of samarium (Sm)-silver (Ag) alloy.

Comparative Example 2

An organic light emitting diode device was fabricated in accordance with the same procedure as in Example 5, except that the cathode was formed of 13.0 nm-thick magnesium (Mg)-silver (Ag) alloy evaporated with magnesium (Mg) and silver (Ag) at a volume ratio of 10:1, instead of the cathode made of samarium (Sm)-silver (Ag) alloy.

Evaluation 2: Efficiency of Organic Light Emitting Diode Device

The organic light emitting diode devices obtained from Examples 5, 6 and Comparative Example 2 were evaluated for the white luminous efficiency. The efficiency was evaluated in a Konica Minolta Display Color Analyzer CA210 (Konica Minolta, Inc., Tokyo, Japan) and determined by the efficiency increase rate relative to the reference (ref) of Comparative Example 2.

The results are shown in Table 1.

TABLE 1

|  | White luminous efficiency (cd/A) | Efficiency increase ratio (%) (relative to reference) |
|---|---|---|
| Example 5 | 24.5 | 10.6 |
| Example 6 | 26.0 | 15.7 |
| Comparative Example 2 (ref.) | 21.9 | 0 |

Referring to Table 1, the organic light emitting diode devices according to Examples 5 and 6 showed better efficiency than that of organic light emitting diode device according to Comparative Examples 2.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode device, comprising
   a first electrode;
   a second electrode facing the first electrode; and
   an emission layer positioned between the first electrode and second electrode,
   wherein the first electrode is a single layer and is an alloy of samarium (Sm), and silver (Ag),
   wherein the samarium (Sm): the silver (Ag) is in a volume ratio of about 1:15 to about 1:20.

2. The organic light emitting diode device of claim 1, wherein the single layer has a thickness of about 30 Å to about 150 Å.

3. The organic light emitting diode device of claim 1, wherein: the first electrode has light transmittance of greater than or equal to about 60% in a wavelength region of about 450 nm to about 700 nm.

4. The organic light emitting diode device of claim 3, wherein the first electrode has light transmittance of about 60% to about 95% in a wavelength region of about 450 nm to about 700 nm.

5. The organic light emitting diode device of claim 1, wherein
   the second electrode comprises a reflecting electrode, and
   the emission layer is configured to emit a white light.

6. The organic light emitting diode device of claim 1, wherein
   the second electrode comprises a transparent electrode, and
   the emission layer is configured to emit a white light.

7. The organic light emitting diode device of claim 1, wherein the first electrode is a cathode.

* * * * *